United States Patent
Soda

(10) Patent No.: US 9,881,950 B2
(45) Date of Patent: Jan. 30, 2018

(54) SOLID-STATE IMAGE SENSOR AND CAMERA WITH LIGHT-SHIELDING PORTIONS AND AMPLIFICATION TRANSISTORS

(71) Applicant: CANON KABUSHIKI KAISHA, Tokyo (JP)

(72) Inventor: Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 468 days.

(21) Appl. No.: 14/247,481

(22) Filed: Apr. 8, 2014

(65) Prior Publication Data

US 2014/0307151 A1   Oct. 16, 2014

(30) Foreign Application Priority Data

Apr. 15, 2013   (JP) .................................. 2013-085268

(51) Int. Cl.
| | |
|---|---|
| *H01L 27/146* | (2006.01) |
| *H04N 5/369* | (2011.01) |
| *H04N 5/232* | (2006.01) |

(52) U.S. Cl.
CPC .... *H01L 27/14603* (2013.01); *H01L 27/1463* (2013.01); *H01L 27/14607* (2013.01); *H01L 27/14609* (2013.01); *H01L 27/14623* (2013.01); *H04N 5/23212* (2013.01); *H04N 5/3696* (2013.01)

(58) Field of Classification Search
CPC ........... H01L 27/14603; H01L 27/1463; H01L 27/14609; H01L 27/14607; H01L 27/14623; H01L 27/14812; H01L 27/14818; H04N 5/23212
See application file for complete search history.

(56) References Cited

U.S. PATENT DOCUMENTS

| | | | |
|---|---|---|---|
| 7,485,903 B2 | 2/2009 | Abe et al. | |
| 7,804,116 B2 | 9/2010 | Abe et al. | |
| 7,816,711 B2 | 10/2010 | Abe et al. | |
| (Continued) | | | |

FOREIGN PATENT DOCUMENTS

| | | |
|---|---|---|
| JP | 2005-142251 A | 6/2005 |
| JP | 2009-105358 A | 5/2009 |
| (Continued) | | |

*Primary Examiner* — Twyler Haskins
*Assistant Examiner* — Akshay Trehan
(74) *Attorney, Agent, or Firm* — Fitzpatrick, Cella, Harper & Scinto

(57) ABSTRACT

The solid-state image sensor includes image sensing pixels, first and second focus detection pixels configured to respectively detect lights passing through different regions of a pupil of an image sensing lens. The sensor includes a semiconductor substrate including photoelectric converters of the image sensing pixels, a photoelectric converter and a first well contact region of the first focus detection pixel, and a photoelectric converter and a second well contact region of the second focus detection pixel, a first contact plug electrically connected to the first well contact region, and a second contact plug electrically connected to the second well contact region. The relative position of the first well contact region in the first focus detection pixel differs from a relative position of the second well contact region in the second focus detection pixel.

21 Claims, 5 Drawing Sheets

(56) References Cited

U.S. PATENT DOCUMENTS

| | | |
|---|---|---|
| 8,349,640 B2 | 1/2013 | Soda |
| 8,964,084 B2* | 2/2015 | Yamashita ............. H04N 5/374 |
| | | 348/308 |
| RE45,891 E | 2/2016 | Abe et al. |
| 2009/0021620 A1 | 1/2009 | Inagaki et al. |
| 2010/0176272 A1* | 7/2010 | Itahashi ............ H01L 27/14609 |
| | | 250/208.1 |
| 2012/0301989 A1* | 11/2012 | Hashimoto ............. H01L 31/18 |
| | | 438/57 |
| 2013/0088621 A1* | 4/2013 | Hamada ............... H04N 5/3696 |
| | | 348/281 |
| 2013/0141617 A1 | 6/2013 | Soda |
| 2014/0091368 A1* | 4/2014 | Miyagawa ........ H01L 27/14603 |
| | | 257/222 |
| 2014/0111663 A1 | 4/2014 | Soda |
| 2014/0132812 A1 | 5/2014 | Soda |
| 2016/0141319 A1 | 5/2016 | Abe et al. |

FOREIGN PATENT DOCUMENTS

| | | |
|---|---|---|
| JP | 2011-060815 A | 3/2011 |
| WO | 2006/018968 A1 | 2/2006 |

\* cited by examiner

SOLID-STATE IMAGE SENSOR AND CAMERA WITH LIGHT-SHIELDING PORTIONS AND AMPLIFICATION TRANSISTORS

BACKGROUND OF THE INVENTION

Field of the Invention

The present invention relates to a solid-state image sensor and a camera.

Description of the Related Art

There is known a technique of implementing focus detection without using any dedicated automatic focus detection (AF) sensor by making a solid-state image sensor used in a digital video camera, digital still camera, or the like have a phase-difference detection function. For example, the solid-state image sensor disclosed in Japanese Patent Laid-Open No. 2011-60815 has openings formed in the light shielding layers of some pixels so as to have eccentric centers relative to the optical axes of microlenses, thereby dividing the pupil of an image sensing lens.

A solid-state image sensor is provided with a well contact region for fixing the potential of a well in which circuit elements such as a photoelectric converter and a transistor are formed. A reference potential line is electrically connected to the well contact region via a contact plug. Japanese Patent Laid-Open No. 2011-60815 has no description or suggestion about how to arrange well contact regions.

SUMMARY OF THE INVENTION

The present invention provides the advantageous placement of well contact regions in a solid-state image sensor having a focus detection function.

One of aspects of the present invention provides a solid-state image sensor including a plurality of image sensing pixels configured to sense an image of an object, a first focus detection pixel configured to detect light passing through a first region of a pupil of an image sensing lens, and a second focus detection element configured to detect light passing through a second region different from the first region of the pupil, the sensor comprising: a semiconductor substrate including photoelectric converters of the plurality of image sensing pixels, a photoelectric converter and a first well contact region of the first focus detection pixel, and a photoelectric converter and a second well contact region of the second focus detection pixel; a first light shielding portion configured to define the first region and shield the first well contact region from light; a second light shielding portion configured to define the second region and shield the second well contact region from light; a first contact plug electrically connected to the first well contact region; and a second contact plug electrically connected to the second well contact region, wherein a relative position of the first well contact region in the first focus detection pixel with respect to an element included in the first focus detection pixel differs from a relative position of the second well contact region in the second focus detection pixel with respect to an element corresponding to the element included in the first focus detection pixel.

Further features of the present invention will become apparent from the following description of exemplary embodiments with reference to the attached drawings.

DESCRIPTION OF THE EMBODIMENTS

A solid-state image sensor according to the present invention includes a plurality of image sensing pixels for sensing an image of an object, a plurality of first focus detection pixels which detect light passing through the first region of the pupil of an image sensing lens, and a plurality of second focus detection pixels which detect light passing through the second region different from the first region of the pupil. It is possible to detect a focus by a phase-difference detection method based on outputs from the plurality of first focus detection pixels and outputs from the plurality of second focus detection pixels. The solid-state image sensor of the present invention can be formed as a MOS solid-state image sensor or CCD solid-state image sensor.

Figure 1:
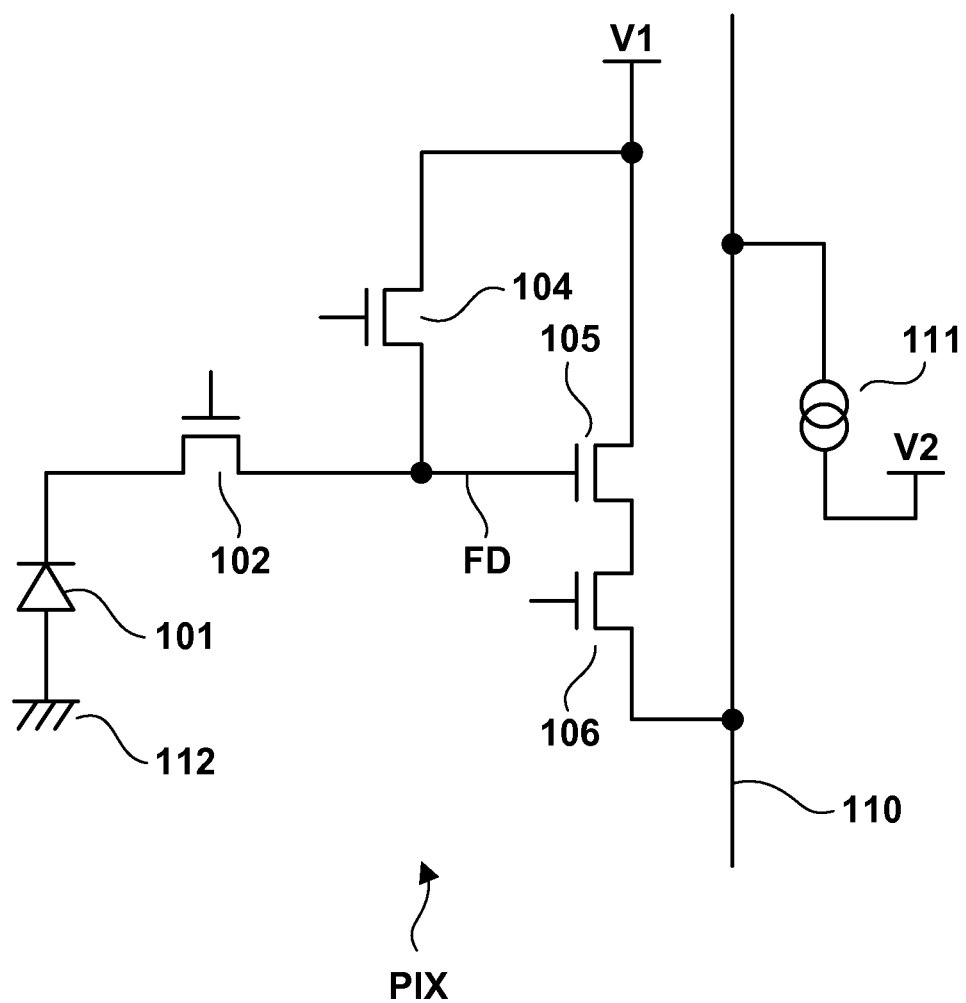
FIG. 1 is a circuit diagram exemplarily showing the circuit arrangement of one pixel of a solid-state image sensor according to one embodiment of the present invention.

A case in which the present invention is applied to a MOS solid-state image sensor as an embodiment of the present invention will be described below. FIG. 1 exemplarily shows the circuit arrangement of one pixel PIX of a solid-state image sensor according to one embodiment of the present invention. Image sensing pixels, the first focus detection pixels, and the second focus detection pixels can have a circuit arrangement like that shown in FIG. 1. The pixel PIX includes a photoelectric converter 101. The photoelectric converter 101 can be, for example, a photodiode. The photoelectric converter has a charge accumulation region for accumulating charges generated by photoelectric conversion. In the case shown in FIG. 1, the pixel PIX accumulates electrons, of the electrons and holes which are generated by photoelectric conversion, and outputs a signal corresponding to the amount of electrons as a pixel signal. However, the pixel PIX may be configured to accumulate holes and output a signal corresponding to the amount of holes as a pixel signal.

The pixel PIX can include a transfer transistor 102 which transfers the charges accumulated in the photoelectric converter 101 to a floating diffusion FD. The pixel PIX can also include an amplification transistor 105 which outputs a signal corresponding to the amount of charges transferred to the pixel PIX or the floating diffusion FD to a column signal line 110. In this case, one end of a current source 111 is connected to the column signal line 110. The amplification transistor 105 and the current source 111 can constitute a source follower circuit. A potential V2 can be applied to the other end of the current source 111. The pixel PIX can include a reset transistor 104 which resets the potential of the floating diffusion FD. The pixel PIX may include a selection transistor 106. A vertical scanning circuit (not shown) activates the selection transistor 106 to set the pixel PIX in a selected state. In the scheme of setting the pixel PIX in a selected or unselected state depending on the potential set for the floating diffusion FD, the selection transistor 106 is not required. The selection transistor 106 can be arranged between, for example, the amplification transistor 105 and the column signal line 110. A potential V1 can be applied to the drains of the reset transistor 104 and amplification transistor 105.

A reference potential such as a ground potential is applied to the photoelectric converter 101, the transfer transistor 102, the amplification transistor 105, the reset transistor 104, and the selection transistor 106 via well contact regions of the semiconductor substrate and the contact plugs connected to them. If the photoelectric converter 101 is formed from a photodiode and accumulates electrons in the cathode, a ground potential 112 is applied to the anode via a well contact region formed in a well and the contact plug connected to the region. If the transistors 102, 104, 105, and 106 are formed from NMOS transistors, the ground potential 112 is applied to them as a substrate bias via well contact regions formed in wells of the semiconductor substrate and the contact plugs connected to the regions.

Figure 2A:
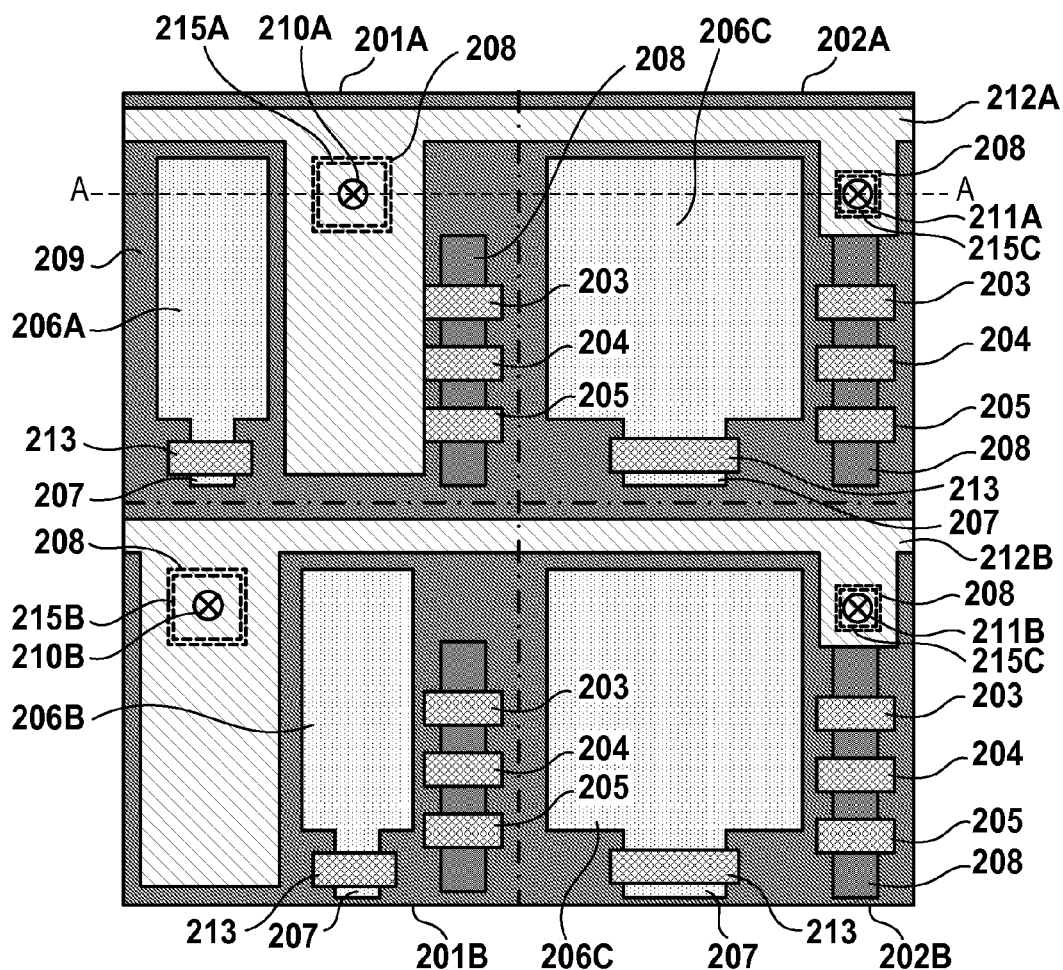
FIGS. 2A and 2B are views showing part of the pixel array of a solid-state image sensor according to the first embodiment of the present invention.
Figure 2B:
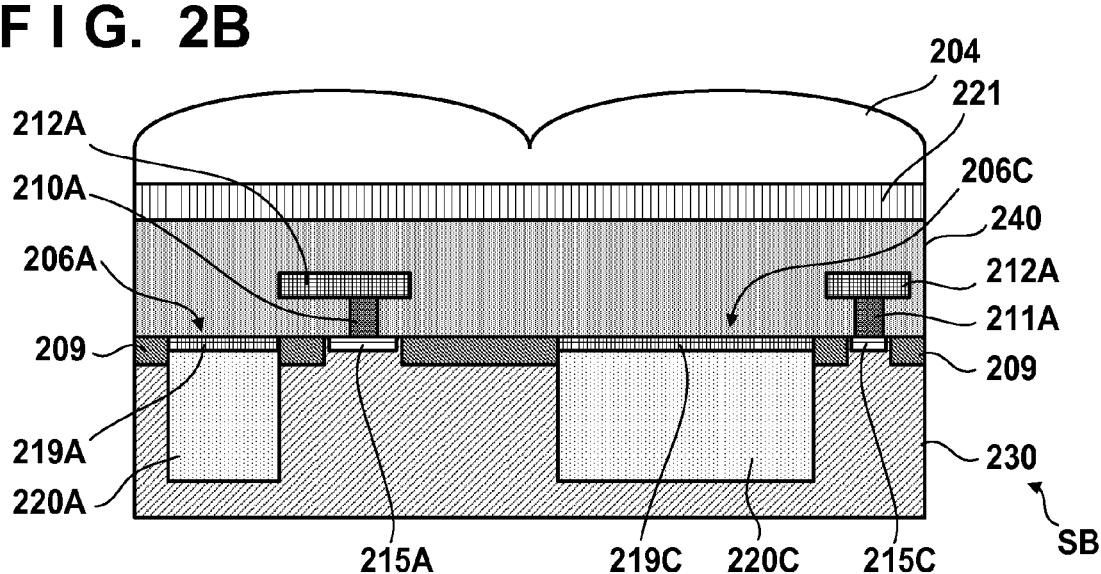

FIG. 2A shows the layout (plan view) of part (four pixels) of the pixel array of the solid-state image sensor according to the first embodiment of the present invention. More specifically, FIG. 2A shows two image sensing pixels 202A and 202B, a first focus detection pixel 201A, and a second focus detection pixel 201B. The first focus detection pixel 201A detects light passing through a first region of the pupil of the image sensing lens. The second focus detection pixel 201B detects light passing through a second region different from the first region of the pupil. FIG. 2B is a sectional view taken along a line A-A in FIG. 2A.

The first focus detection pixel 201A includes a photoelectric converter 206A, a transfer transistor, a selection transistor, an amplification transistor, and a reset transistor. The second focus detection pixel 201B includes a photoelectric converter 206B, a transfer transistor, a selection transistor, an amplification transistor, and a reset transistor. Each of the image sensing pixels 202A and 202B includes a photoelectric converter 206C, a transfer transistor, a selection transistor, an amplification transistor, and a reset transistor. The transfer transistors, the selection transistors, the amplification transistors, and the reset transistors respectively include gate electrodes 213, 203, 204, and 205.

The photoelectric converter 206A of the first focus detection pixel 201A can be constituted by, for example, a p-type surface region 219A, an n-type charge accumulation region 220A, and a p-type well 230. Like the photoelectric converter 206A of the first focus detection pixel 201A, the photoelectric converter 206B of the second focus detection pixel 201B can be constituted by a p-type surface region, an n-type charge accumulation region, and a p-type well 230. The photoelectric converters 206C of the image sensing pixels 202A and 202B each can be constituted by a p-type surface region 219C, an n-type charge accumulation region 220C, and a p-type well 230.

The solid-state image sensor includes a semiconductor substrate SB having the p-type well 230. The semiconductor substrate SB includes an element isolation 209. The element isolation 209 defines an active region 208. The element isolation 209 can have an isolation structure including an insulator such as an STI (Shallow Trench Isolation) or LOCOS (Local Oxidation of Silicon). The active region 208 includes, for example, the surface regions of the photoelectric converters 206A, 206B, and 206C, a floating diffusion 207, and the source, drain, and channel regions of each transistor. In addition, the active region 208 includes a first well contact region 215A of the first focus detection pixel 201A, a second well contact region 215B of the second focus detection pixel 201B, and third well contact regions 215C of the image sensing pixels 202A and 202B. In this embodiment, well contact regions are arranged in only some image sensing pixels. However, well contact regions may be arranged in all the image sensing pixels.

In the case shown in FIGS. 2A and 2B, the selection transistor, amplification transistor, and reset transistor of each pixel are formed by arranging gate electrodes 203, 204, and 205 on one active region 208 at predetermined intervals, with the respective transistors commonly having source and drain regions. Part or all of the element isolation 209 may be formed by p-n junction isolation. In this case, a plurality of pixels or all pixel elements can be arranged in one continuous active region 208.

A first contact plug 210A is electrically connected to the first well contact region 215A to supply a ground potential to the active region 208 of the first focus detection pixel 201A. A ground line (metal wiring pattern) 212A is electrically connected to the first contact plug 210A. Likewise, a second contact plug 210B is electrically connected to the second well contact region 215B to supply a ground potential to the active region 208 of the second focus detection pixel 201B. A ground line (metal wiring pattern) 212B is electrically connected to the second contact plug 210B. The ground line 212A includes the first light shielding portion which shields the first well contact region 215A from light, while defining the first region described above in the pupil of the image sensing lens. The ground line 212B includes the second light shielding portion which shields the second well contact region 215B from light, while defining the second region described above in the pupil of the image sensing lens. Phase difference detection by pupil division is implemented by detecting light passing through the first region of the image sensing lens using the first focus detection pixel 201A, and detecting light passing through the second region of the image sensing lens using the second focus detection pixel 201B, in the above manner.

The ground lines 212A and 212B can be formed as part of a wiring structure 240 including wiring patterns, contact plugs, and via plugs. Color filters 221 and/or microlenses 204 can be arranged on the wiring structure 240.

The first focus detection pixel 201A and the second focus detection pixel 201B constitute a pair of pixels for phase difference detection. In the first focus detection pixel 201A and the second focus detection pixel 201B constituting a pair for phase difference detection, the photoelectric converters are arranged at different relative positions. Accordingly, the relative position of the first well contact region 215A in the first focus detection pixel 201A with respect to a given element differs from the relative position of the second well contact region 215B in the second focus detection pixel 201B with respect to the corresponding pixel. That is, consider that the layout of the first focus detection pixel 201A is translated and is further rotated and reversed, as needed, so as to overlap a given element in the first focus detection pixel 201A with the corresponding element in the second focus detection pixel 201B. In this case, the first well contact region 215A is moved to a position different from that of the second well contact region 215B of the second focus detection pixel 201B. In addition, the relative position of the first contact plug 210A in the first focus detection pixel 201A differs from the relative position of the second contact plug 210B in the second focus detection pixel 201B. Differentiating the relative positions of the well contact regions (or the contact plugs) in the first focus detection pixel 201A and the second focus detection pixel 201B, which constitute a pair for phase difference detection, is advantageous in improving the degree of freedom in layout.

The ground lines 212A and 212B can be formed as part of the wiring structure 240 including wiring patterns, contact plugs, and via plugs. The color filters 221 and/or the microlenses 204 can be arranged on the wiring structure 240.

A third contact plug 211A is electrically connected to the third well contact region 215C of the image sensing pixel 202A to supply a ground potential to the active region 208 of the image sensing pixel 202A. The ground line (metal wiring pattern) 212A is electrically connected to the third contact plug 211A. Likewise, a third contact plug 211B is electrically connected to the third well contact region 215C of the image sensing pixel 202B to supply a ground potential to the active region 208 of the image sensing pixel 202B. The ground line (metal wiring pattern) 212B is electrically connected to the third contact plug 211A.

The image sensing pixel 202A and the image sensing pixel 202B can have symmetrical structures. For example, such structures include structures having translational symmetry, rotational symmetry, and mirror symmetry and a structure having a combination thereof. In this embodiment, the two image sensing pixels 202A and 202B have a translational symmetrical structure. In this case, the relative position of the third well contact region 215C in the image sensing pixel 202A coincides with the relative position of the third well contact region 215C in the image sensing pixel 202B. Alternatively, the image sensing pixel 202A and the image sensing pixel 202B may have structures having no symmetry to each other. If, for example, the image sensing pixel 202A and the image sensing pixel 202B share an amplification transistor, the image sensing pixel 202A and the image sensing pixel 202B can have structures having no symmetry to each other.

In this embodiment, the relative position of the third well contact region 215C in the image sensing pixel 202A (202B) with respect to a given element differs from the relative position of the first well contact region 215A in the first focus detection pixel 201A with respect to the corresponding element. That is, consider a case in which the layout of the first focus detection pixel 201A is translated and is further rotated and reversed, as needed, to overlap a given element in the first focus detection pixel 201A with the corresponding element in the image sensing pixel 202A (202B). In this case, the first well contact region 215A is moved to a position different from that of the third well contact region 215C in the image sensing pixel 202A. The elements corresponding to each other are elements or portions such as a reset transistor in the first focus detection pixel and a reset transistor in an image sensing element, which have similar functions in the two different pixels. In addition, the relative position of the third well contact region 215C in the image sensing pixel 202A (202B) differs from the relative position of the second well contact region 215B in the second focus detection pixel 201B.

The impurity concentration of the well contact regions 215A, 215B, and 215C is higher than that of the well 230. Providing the well contact regions 215A, 215B, and 215C can decrease the contact resistance with the contact plugs 210A, 210B, and 211A (211B). In the case shown in FIGS. 2A and 2B, a well contact region and the surface region of a photoelectric converter are arranged in different active regions, respectively. In other words, the well contact region is electrically isolated from the surface region of the photoelectric converter by the element isolation 209 including an insulator. However, this is a merely an example, and the well contact region and the surface region of the photoelectric converter may be arranged in the same active region.

The well 230 may be shared by a plurality of pixels or all pixels or may be provided for each pixel. According to the above description, a ground potential is supplied to the well 230 via the well contact regions 215A, 215B, and 215C, but an arbitrary potential other than a ground potential can be supplied to the p-type well.

Since the above case has exemplified the solid-state image sensor which accumulates electrons in the photoelectric converters, the well 230 is of the p type. However, in a solid-state image sensor designed to accumulate holes in photoelectric converters, the p type and n type in the above case are interchanged.

The potential of a well in which an amplification transistor and a reset transistor are arranged is an important factor when determining the operation characteristics of the respective transistors. The existence of an uneven potential distribution in a region in which a pixel array is arranged can generate shading in a sensed image. It is therefore preferable to make the well, in which a pixel array is arranged, have an equipotential distribution by arranging many contact plugs in the well. On the other hand, arranging many contact plugs may cause dark currents to flow into photoelectric converters via the contact plugs and the well contact regions. The generation of dark currents in the photoelectric converters of image sensing pixels adversely affects an image in a dark period, in particular. Since a signal from a focus detection pixel is not used as a signal for directly forming an image, it is therefore more important to suppress a dark current generated in an image sensing pixel than to suppress a dark current generated in a focus detection pixel. Therefore, it is necessary to make the suppression of shading and the suppression of a dark current generated in an image sensing pixel compatible.

Figure 5A:
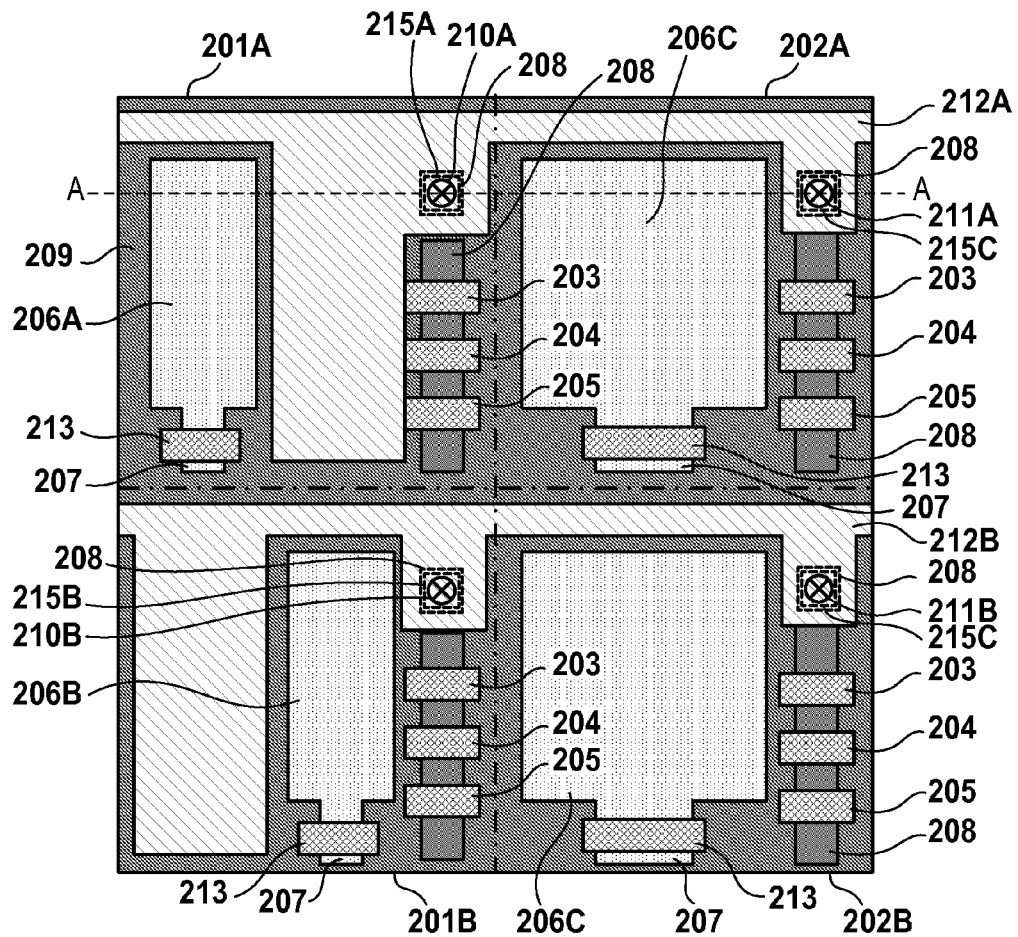
FIGS. 5A and 5B are views showing a comparative example.
Figure 5B:
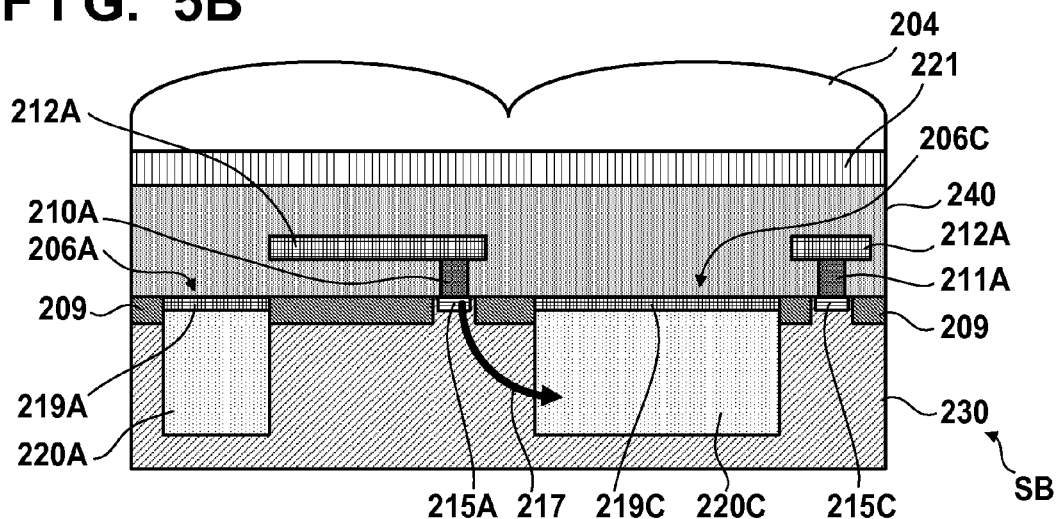

FIG. 5A shows the layout (plan view) of part (four pixels) of the pixel array of a solid-state image sensor according to a comparative example. FIG. 5B is a sectional view taken along a line A-A in FIG. 5A. In the comparative example, the relative positions of well contact regions 215A and 215B in focus detection pixels 201A and 201B coincide with the relative positions of well contact regions 215C in image sensing pixels 202A and 202B. This arrangement is advantageous in suppressing shading by making a well 230 have a uniform potential. However, the arrangement is disadvantageous in suppressing dark currents 217 flowing from contact plugs 210A and 210B for the focus detection pixel 201A and 201B and the well contact regions 215A and 215B into a photoelectric converter 206C. For example, the dark currents 217 flowing from the contact plug 210A for the focus detection pixel 201A and the well contact region 215A into the photoelectric converter 206C in the adjacent image sensing pixel 202A can adversely affect an image in a dark period.

Individually determining the relative positions of well contact regions in a focus detection pixel and an image sensing pixel as in the first embodiment is advantageous in making the suppression of shading and the suppression of a dark current in the image sensing pixel compatible. As compared with the case shown in FIGS. 5A and 5B, the first embodiment enables large distances to be set from the contact plug 210A for the focus detection pixel 201A and the well contact region 215A to the photoelectric converter 206C in the adjacent image sensing pixel 202A. The larger the distance between the well contact region 215A and the photoelectric converter 206C, the smaller a dark current flowing from the well contact region 215A to the photoelectric converter 206C. It is therefore possible to suppress a dark current to the photoelectric converter 206C. In addition to this method, there is available a method of suppressing a dark current by placing a barrier for preventing the entrance of charges between the well contact region 215A and the photoelectric converter 206C of the adjacent image sensing pixel 202A. The placement of such a barrier can be performed without any layout constraints, and hence is advantageous in suppressing a dark current.

In addition, arranging the well contact regions 215A and 215B in the regions light-shielded by the ground lines 212A and 212B in the focus detection pixels is advantageous in suppressing dark currents in the adjacent image sensing pixels.

Figure 3A:
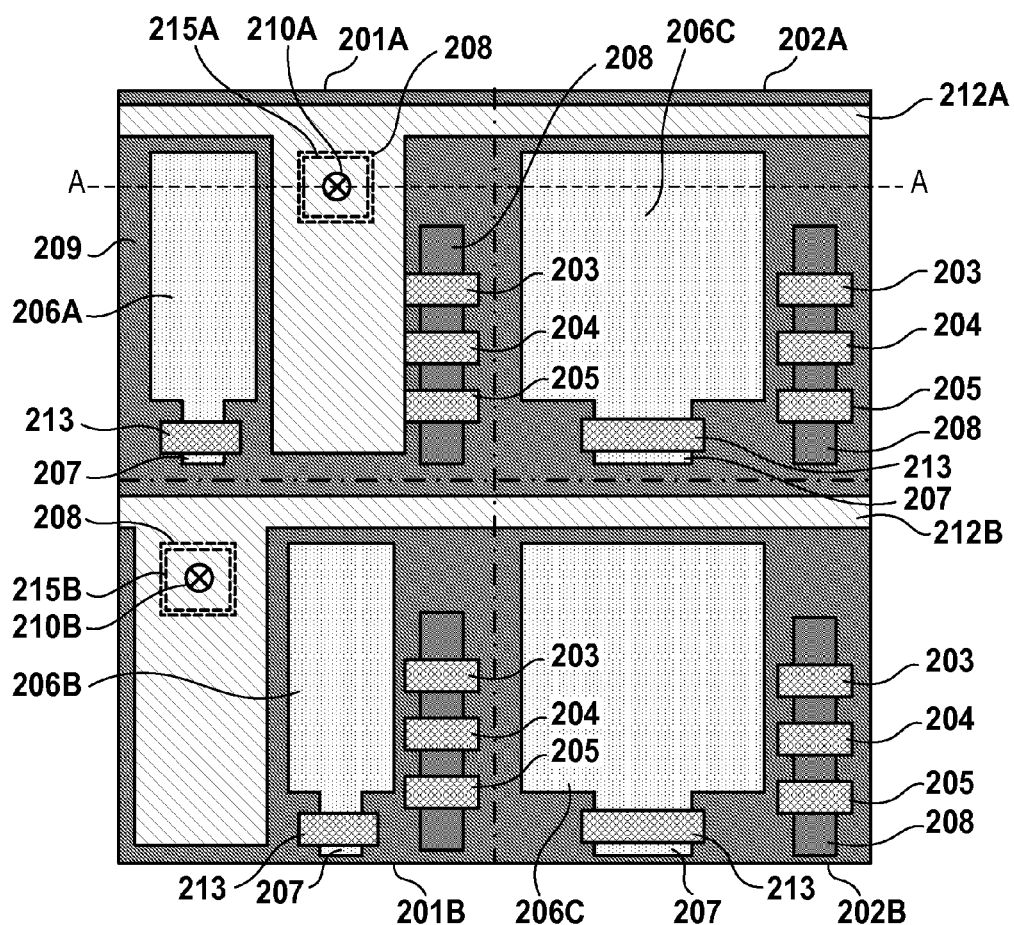
FIGS. 3A and 3B are views showing part of the pixel array of a solid-state image sensor according to the second embodiment of the present invention.
Figure 3B:
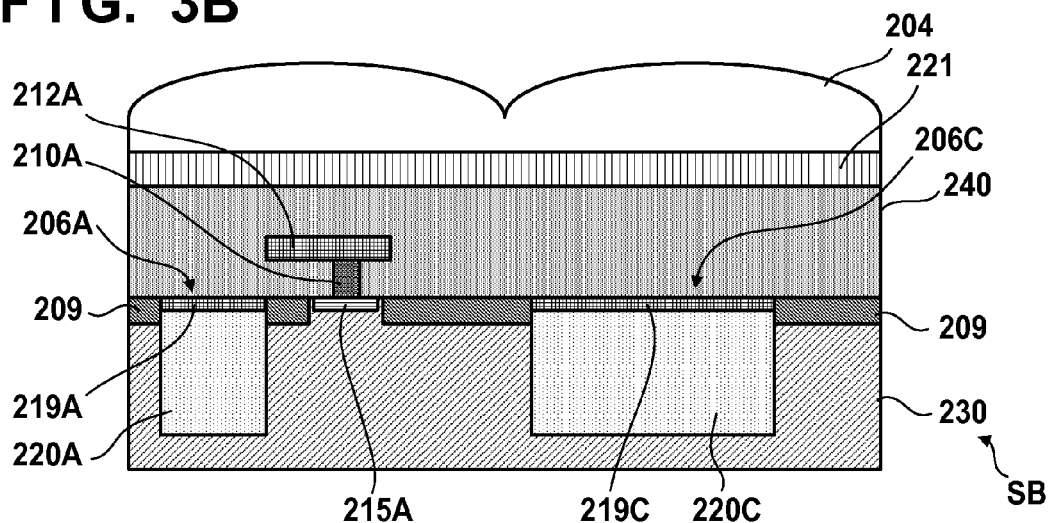

The second embodiment of the present invention will be described with reference to FIGS. 3A and 3B. FIG. 3A shows the layout (plan view) of part (four pixels) of the pixel array of a solid-state image sensor according to the second embodiment of the present invention. More specifically, FIG. 3A shows two image sensing pixels 202A and 202B, a first focus detection pixel 201A, and a second focus detection pixel 201B. The first focus detection pixel 201A detects light passing through the first region of the pupil of an image sensing lens. The second focus detection pixel 201B detects light passing through the second region different from the first region of the pupil. FIG. 3B is a sectional view taken along a line A-A in FIG. 3A. Note that particulars that are not described in the second embodiment can comply with the first embodiment.

In the second embodiment, the focus detection pixels 201A and 201B are provided with well contact regions and contact plugs for supplying a ground potential to a well 230. However, the second embodiment differs from the first embodiment in that some image sensing pixels 202A and 202B are not provided with well contact regions and contact plugs.

Providing no well contact regions and contact plugs for the image pixels 202A and 202B can suppress the generation of dark currents in the image sensing pixels 202A and 202B due to well contact regions and contact plugs. If the degree of shading caused by the potential distribution of the well 230 falls within an allowable range, there is no need to arrange well contact regions and contact plugs in all the focus detection pixels including the focus detection pixels 201A and 201B. That is, if the degree of shading falls within the allowable range, well contact regions and contact plugs may be arranged in only some of the plurality of focus detection pixels. Consider a case in which the layout of the focus detection pixel 201A is translated and is further rotated and reversed, as needed, so as to overlap some element of the first focus detection pixel 201A with the corresponding element of the image sensing pixel 202A (202B) having no well contact region. In this case, a first well contact region 215A is moved to a position different from that of a well contact region. Therefore, the relative position of the first well contact region 215A in the first focus detection pixel 201A with respect to a given element differs from the image sensing pixel 202A (202B).

If the gate area of an amplification transistor is small, the generation of 1/f noise may adversely affect pixel characteristics. In the second embodiment, since no contact plug for supplying a ground potential to an image sensing pixel is arranged, it is possible to increase the gate area of an amplification transistor of an image sensing pixel accordingly as compared with the case in which a contact plug is arranged in the image sensing pixel. This can suppress the generation of 1/f noise. In addition, since the area of the photoelectric converter of an image sensing pixel can be increased as compared with the case in which a contact plug is arranged in an image sensing pixel, it is possible to improve the sensitivity of the image sensing pixel.

Figure 4A:
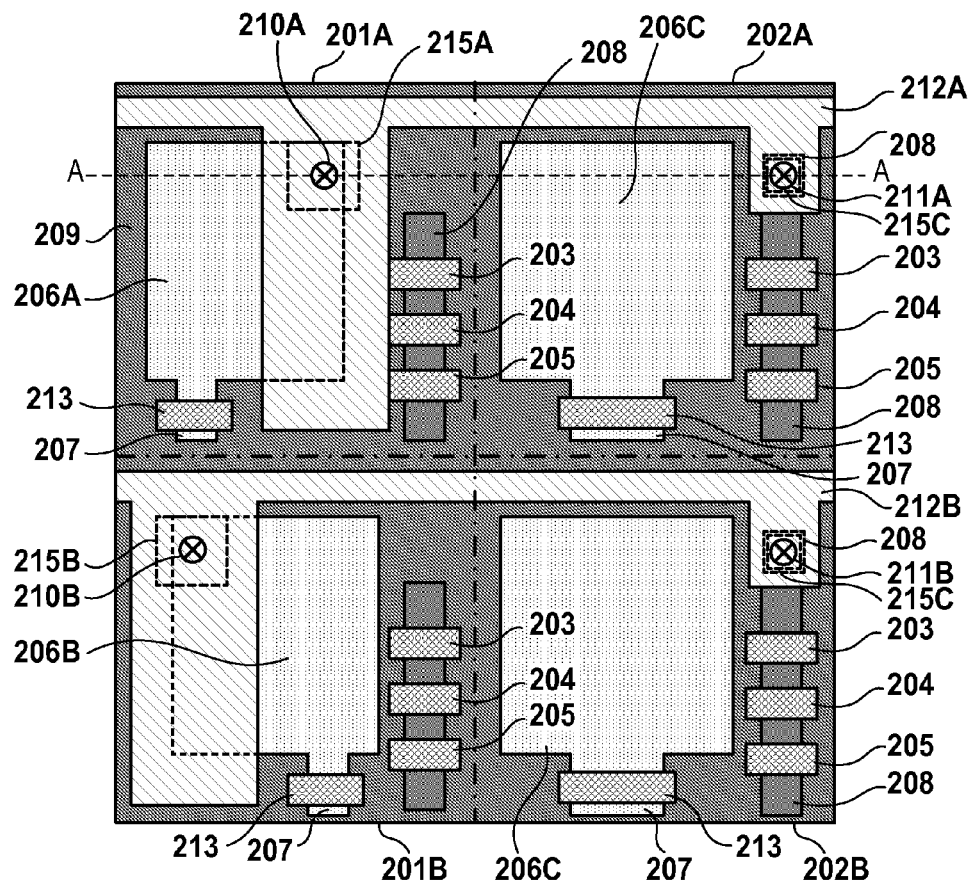
FIGS. 4A and 4B are views showing part of the pixel array of a solid-state image sensor according to the third embodiment of the present invention.
Figure 4B:
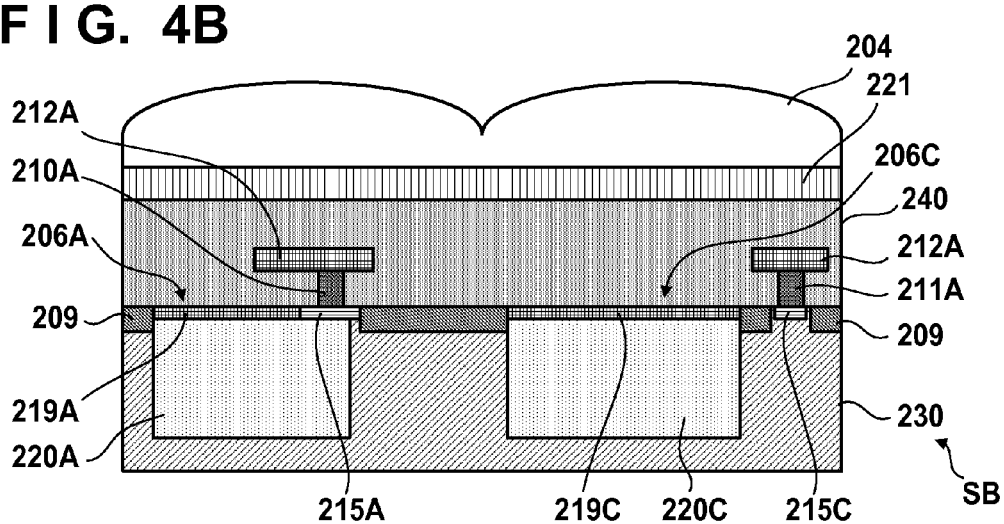

The third embodiment of the present invention will be described with reference to FIGS. 4A and 4B. FIG. 4A shows the layout (plan view) of part (four pixels) of the pixel array of a solid-state image sensor according to third embodiment of the present invention. More specifically, FIG. 4A shows two image sensing pixels 202A and 202B, a first focus detection pixel 201A, and a second focus detection pixel 201B. The first focus detection pixel 201A detects light passing through the first region of the pupil of an image sensing lens. The second focus detection pixel 201B detects light passing through the second region different from the first region of the pupil. FIG. 4B is a sectional view taken along a line A-A in FIG. 4A. Note that particulars that are not described in the third embodiment can comply with the first embodiment.

The third embodiment differs from the first embodiment in that contact plugs 210A and 210B for the focus detection pixels 201A and 201B are connected to surface regions 219A of photoelectric converters 206A and 206B (the surface region of the photoelectric converter 206B is not shown) of the focus detection pixels 201A and 201B. In the third embodiment, since well contact regions 215A and 215B are not isolated from the photoelectric converters 206A and 206B by element isolation 209, it is possible to increase the regions of the photoelectric converters 206A and 206B. This contributes to an increase in the dynamic ranges of the first focus detection pixels 201A and 201B.

The camera incorporated in a solid-state image sensor according to each embodiment described above will be exemplarily described as an application example of the solid-state image sensor. The concept of the camera includes not only an apparatus mainly designed to perform imaging but also an apparatus including an imaging function as an auxiliary function (for example, a personal computer or a portable terminal). The camera includes a solid-state image sensor according to the present invention exemplified as the above embodiment and a processor which processes the signal output from the solid-state image sensor. The processor can include, for example, an A/D converter and a processor which processes the digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-085268, filed Apr. 15, 2013, which is hereby incorporated by reference herein in its entirety.

What is claimed is:

1. A solid-state image sensor including a plurality of image sensing pixels configured to sense an image of an object, a first pixel configured to detect light passing through a pupil of an image sensing lens, and a second pixel configured to detect light passing through a different portion of the pupil, the sensor comprising:
    a semiconductor substrate having a first surface and a second surface arranged opposite to the first surface, the semiconductor substrate including, between the first surface and the second surface:
        a well having a first conductivity,
        photoelectric converters of the plurality of image sensing pixels, a first photoelectric converter and a first semiconductor region of the first pixel, the first photoelectric converter including a first part of the well and a first charge accumulation region having a second conductivity arranged in the well, the second conductivity being different from the first conductivity, and a second photoelectric converter and a second semiconductor region of the second pixel, the second photoelectric converter including a second part of the well and a second charge accumulation region having the second conductivity arranged in the well;

a first light shielding portion arranged above the first surface and configured to shield the first semiconductor region from light;

a second light shielding portion arranged above the first surface and configured to shield the second semiconductor region from light;

a first amplification transistor associated with the first photoelectric converter;

a second amplification transistor associated with the second photoelectric converter;

a first contact plug arranged over and in contact with the first semiconductor region to supply a potential to the well through the first semiconductor region; and a second contact plug arranged over and in contact with the second semiconductor region to supply a potential to the well through the second semiconductor region, wherein a first distance between the first semiconductor region and a gate electrode of the first amplification transistor differs from a second distance between the second semiconductor region and a gate electrode of the second amplification transistor.

2. The sensor according to claim 1, wherein the semiconductor substrate further includes, between the first surface and the second surface, a third active region and a third semiconductor region of the image sensing pixel, the third active region including an active region of a third amplification transistor of the image sensing pixel, the sensor further comprises a third contact plug arranged over and in contact with the first surface and electrically connected to the third semiconductor region, and a third distance between the third semiconductor region and a gate electrode of the third amplification transistor differs from the first distance and the second distance.

3. The sensor according to claim 1, wherein the first contact plug is electrically connected to the first light shielding portion, and the second contact plug is electrically connected to the second light shielding portion.

4. The sensor according to claim 1, wherein the first semiconductor region is arranged in the photoelectric converter of the first pixel, and the second semiconductor region is arranged in the photoelectric converter of the second pixel.

5. The sensor according to claim 1, wherein one or some of the plurality image sensing pixels have no semiconductor region to which a contact plug configured to supply a potential to a well in which the image sensing pixel is arranged is connected.

6. The sensor according to claim 1, wherein the first pixel and the second pixel constitute a pair to detect a phase difference.

7. The sensor according to claim 1, wherein the gate electrode of the first amplification transistor and the gate electrode of the second amplification transistor are arranged between the semiconductor substrate and a layer in which the first light shielding portion and the second light shielding portion are arranged.

8. A camera comprising:
a solid-state image sensor defined in claim 1; and
a processing unit configured to process a signal output from the solid-state image sensor.

9. A solid-state image sensor including a plurality of image sensing pixels configured to sense an image of an object, a first pixel configured to detect light passing through a pupil of an image sensing lens, and a second pixel configured to detect light passing through a different portion of the pupil, the sensor comprising:

a semiconductor substrate having a first surface and a second surface arranged opposite to the first surface, the semiconductor substrate including, between the first surface and the second surface:

a well having a first conductivity, photoelectric converters and a semiconductor region of the plurality of image sensing pixels, each of the photoelectric converters including a part of the well and a charge accumulation region having a second conductivity arranged in the well, the second conductivity being different from the first conductivity, and a first photoelectric converter and a first semiconductor region of the first pixel, the first photoelectric converter including a first part of the well and a first charge accumulation region having the second conductivity arranged in the well;

a first amplification transistor associated with the first photoelectric converter;

a second amplification transistor associated with a corresponding photoelectric converter among the photoelectric converters;

a first light shielding portion arranged on the first surface and configured to shield the first semiconductor region from light;

a contact plug arranged over and in contact with the first surface and electrically connected to the semiconductor region to supply a potential to the well through the semiconductor region; and a first contact plug arranged over and in contact with the first surface and electrically connected to the first semiconductor region to supply a potential to the well through the first semiconductor region, wherein a distance between the semiconductor region in an image sensing pixel of the plurality of image sensing pixels and a gate electrode of the second amplification transistor in the image sensing pixel differs from a distance between the first semiconductor region and a gate electrode of the first amplification transistor.

10. The sensor according to claim 9, wherein the first contact plug is electrically connected to the first light shielding portion.

11. The sensor according to claim 9, wherein the first semiconductor region is arranged in the same active region as an active region of the photoelectric converter of the first pixel.

12. The sensor according to claim 9, wherein some of the image sensing pixels have no semiconductor region to which a contact plug configured to supply a potential to a well in which the image sensing pixel is arranged is connected.

13. The sensor according to claim 9, wherein the first pixel and the second pixel constitute a pair to detect a phase difference.

14. The sensor according to claim 9, wherein the gate electrode of the first amplification transistor and the gate electrode of the second amplification transistor are arranged between the semiconductor substrate and a layer in which the first light shielding portion is arranged.

15. A camera comprising:
a solid-state image sensor defined in claim 9; and
a processing unit configured to process a signal output from the solid-state image sensor.

16. A solid-state image sensor including an image sensing pixel, and a first pixel configured to detect light passing through a pupil of an image sensing lens, the sensor comprising:
a semiconductor substrate having a first surface and a second surface arranged opposite to the first surface, the semiconductor substrate including, between the first surface and the second surface:
a well having a first conductivity,
a photoelectric converter of the image sensing pixel and a semiconductor region of the image sensing pixel, the photoelectric converter including a part of the well and a charge accumulation region having a second conductivity arranged in the well, the second conductivity being different from the first conductivity, and
a first photoelectric converter and a first semiconductor region of the first pixel, the first photoelectric converter including a first part of the well and a first charge accumulation region having the second conductivity arranged in the well;
a first light shielding portion arranged above the first surface and configured to shield the first semiconductor region from light;
a first amplification transistor associated with the first photoelectric converter; a second amplification transistor associated with the photoelectric converter;
a contact plug arranged over and in contact with the semiconductor region to supply a potential to the well through the semiconductor region; and
a first contact plug arranged over and in contact with the first semiconductor region to supply a potential to the well through the first semiconductor region,
wherein a first distance between the contact plug and a gate electrode of the second amplification transistor differs from a second distance between the first semiconductor region and a gate electrode of the first amplification transistor.

17. The sensor according to claim 16, further comprising:
a second pixel configured to detect light passing through a different portion of the pupil, the second pixel including a second photoelectric converter and a second semiconductor region, arranged between the first surface and the second surface of the semiconductor substrate, and a third amplification transistor having a gate electrode arranged above the first surface;
a second light shielding portion arranged above the first surface and configured to shield the second semiconductor region in the semiconductor substrate from light; and a second contact plug arranged over and in contact with the first surface and electrically connected to the second semiconductor region in the semiconductor substrate,
wherein a third distance between the second contact plug and the gate electrode of the third amplification transistor differs from the first distance and the second distance.

18. The sensor according to claim 16, wherein the first contact plug is electrically connected to the first light shielding portion.

19. The sensor according to claim 16, wherein the gate electrode of the first amplification transistor and the gate electrode of the second amplification transistor are arranged between the semiconductor substrate and a layer in which the first light shielding portion is arranged.

20. A camera comprising:
a solid-state image sensor defined in claim 16; and
a processing unit configured to process a signal output from the solid-state image sensor.

21. A solid-state image sensor including a plurality of image sensing pixels configured to sense an image of an object, a first pixel configured to detect light passing through a pupil of an image sensing lens, and a second pixel configured to detect light passing through a different portion of the pupil, the sensor comprising:
a semiconductor substrate having a first surface and a second surface arranged opposite to the first surface, the semiconductor substrate including, between the first surface and the second surface, (a) photoelectric converters of the plurality of image sensing pixels, and (b) a photoelectric converter and a first semiconductor region of the first pixel;
a first light shielding portion arranged above the first surface and configured to shield the first semiconductor region from light;
a first amplification transistor associated with the photoelectric converter of the first pixel;
a second amplification transistor associated with a corresponding photoelectric converter among the photoelectric converters; and
a first contact plug arranged over and in contact with the first surface and electrically connected to the first semiconductor region, the first contact plug being configured to supply a potential to the photoelectric converter through the first semiconductor region,
wherein the first semiconductor region of the first pixel is arranged at a first position, a relative position of the first position in the first pixel being the same with a relative position of a second position in the image sensing pixel, and the second position is in the photoelectric converter of the image sensing pixel, and
wherein a first distance between a semiconductor region and a gate electrode of the first amplification transistor differs from a second distance between a second semiconductor region and a gate electrode of the second amplification transistor.

* * * * *